(12) United States Patent
Huang et al.

(10) Patent No.: US 11,737,332 B2
(45) Date of Patent: *Aug. 22, 2023

(54) DISPLAY PANEL, DISPLAY APPARATUS, LIGHT EMITTING ELEMENT, AND METHOD OF FABRICATING DISPLAY PANEL

(71) Applicant: BOE Technology Group Co., Ltd., Beijing (CN)

(72) Inventors: Qingyu Huang, Beijing (CN); Huajie Yan, Beijing (CN); Liangliang Kang, Beijing (CN); Fudong Chen, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,218

(22) Filed: Apr. 14, 2022

(65) Prior Publication Data
US 2022/0246691 A1 Aug. 4, 2022

Related U.S. Application Data

(63) Continuation of application No. 16/769,563, filed as application No. PCT/CN2019/099652 on Aug. 7, 2019, now Pat. No. 11,348,976.

(51) Int. Cl.
*H01L 23/00* (2006.01)
*H10K 59/35* (2023.01)
(Continued)

(52) U.S. Cl.
CPC .......... *H10K 59/353* (2023.02); *H10K 50/11* (2023.02); *H10K 50/115* (2023.02);
(Continued)

(58) Field of Classification Search
CPC ... H10K 59/353; H10K 50/11; H10K 2101/40
See application file for complete search history.

(56) References Cited

U.S. PATENT DOCUMENTS 11,348,976 B2 * 5/2022 Huang .................... H01L 51/56
2012/0187827 A1   7/2012 Arvid et al.
(Continued)

FOREIGN PATENT DOCUMENTS

CN          102414856 A      4/2012
CN          107958961 A      4/2018
(Continued)

OTHER PUBLICATIONS

International Search Report & Written Opinion dated Apr. 28, 2020, regarding PCT/CN2019/099652.
(Continued)

*Primary Examiner* — Anthony Ho
(74) *Attorney, Agent, or Firm* — Intellectual Valley Law, P.C.

(57) ABSTRACT

A light emitting element, includes a first light emitting layer and a second light emitting layer sequentially stacked; and an intermediate layer between the first light emitting layer and the second light emitting layer, and being in direct contact with the first light emitting layer on one side and in direct contact with the second light emitting layer on another side. Each of the intermediate layer, the first light emitting layer, and the second light emitting layer includes a same host material. The intermediate layer is a non-light emitting layer, and is an undoped layer absent of a dopant for emitting light. The light emitting element is configured to emit a composite light including the first light of the first wavelength range and the second light of the second wavelength range. The first wavelength range includes wavelength longer than the second wavelength range.

20 Claims, 4 Drawing Sheets

(51) Int. Cl.
  *H10K 50/11* (2023.01)
  *H10K 50/115* (2023.01)
  *H10K 50/17* (2023.01)
  *H10K 59/38* (2023.01)
  *H10K 71/00* (2023.01)
  *H10K 101/10* (2023.01)
  *H10K 101/40* (2023.01)

(52) U.S. Cl.
  CPC .......... *H10K 50/171* (2023.02); *H10K 59/38* (2023.02); *H10K 71/00* (2023.02); *H10K 2101/10* (2023.02); *H10K 2101/40* (2023.02)

(56) References Cited

U.S. PATENT DOCUMENTS

| | | |
|---|---|---|
| 2018/0286927 A1 | 10/2018 | Semiconductor |
| 2019/0123292 A1 | 4/2019 | Woo et al. |
| 2020/0273916 A1 | 8/2020 | Jiao et al. |

FOREIGN PATENT DOCUMENTS

| | | |
|---|---|---|
| CN | 108878667 A | 11/2018 |
| CN | 109065740 A | 12/2018 |
| CN | 109698259 A | 4/2019 |
| CN | 109768074 A | 5/2019 |
| KR | 20150089961 A | 8/2015 |

OTHER PUBLICATIONS

First Office Action in the Chinese Patent Application No. 2019800012809, dated Mar. 22, 2022; English translation attached.
Non-Final Office Action in the U.S. Appl. No. 16/769,563, dated Dec. 1, 2021.
Response to Non-Final Office Action in the U.S. Appl. No. 16/769,563, dated Jan. 17, 2022.
Notice of Allowance in the U.S. Appl. No. 16/769,563, dated Jan. 25, 2022.
Second Office Action in the Chinese Patent Application No. 201980001280.9, dated Sep. 8, 2022; English translation attached.

* cited by examiner

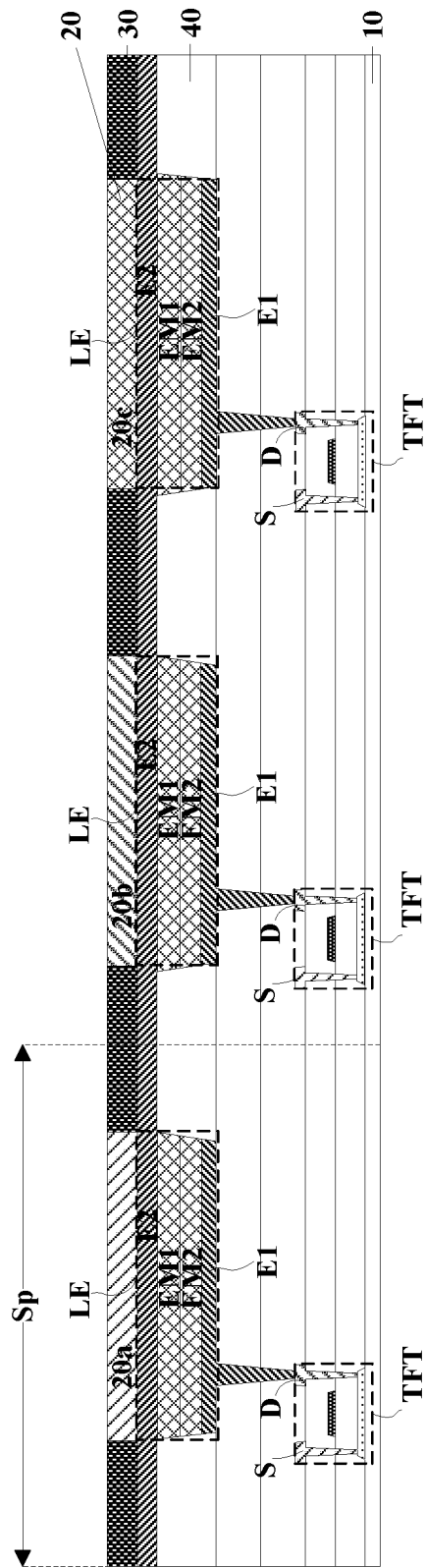

DISPLAY PANEL, DISPLAY APPARATUS, LIGHT EMITTING ELEMENT, AND METHOD OF FABRICATING DISPLAY PANEL

CROSS-REFERENCE TO RELATED APPLICATION

This application is a continuation of U.S. application Ser. No. 16/769,563, filed Aug. 7, 2019, which a national stage application under 35 U.S.C. § 371 of International Application No. PCT/CN2019/099652, filed Aug. 7, 2019. Each of the forgoing applications is herein incorporated by reference in its entirety for all purposes.

TECHNICAL FIELD

The present invention relates to display technology, more particularly, to a display panel, a display apparatus, a light emitting element, and a method of fabricating a display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. In the top-emission type OLED, the cathode is optically transparent, while the anode is reflective.

SUMMARY

In one aspect, the present disclosure provides a light emitting element, comprising a first light emitting layer and a second light emitting layer sequentially stacked; and an intermediate layer between the first light emitting layer and the second light emitting layer, and being in direct contact with the first light emitting layer on one side and in direct contact with the second light emitting layer on another side; wherein the first light emitting layer is configured to emit a first light of a first wavelength range; the second light emitting layer is configured to emit a second light of a second wavelength range; the first wavelength range comprises wavelength longer than the second wavelength range; each of the intermediate layer, the first light emitting layer, and the second light emitting layer comprises a same host material; the intermediate layer is a non-light emitting layer, and is an undoped layer absent of a dopant for emitting light; and the light emitting element is configured to emit a composite light comprising the first light of the first wavelength range and the second light of the second wavelength range.

Optionally, the first light emitting layer further comprises a first guest material; the second light emitting layer further comprises a second guest material; the first guest material has a first HOMO-LUMO energy gap; the second guest material has a second HOMO-LUMO energy gap; and the second HOMO-LUMO energy gap is greater than the first HOMO-LUMO energy gap.

Optionally, a ratio of the second HOMO-LUMO energy gap to the first HOMO-LUMO energy gap is greater than 1.2:1.

Optionally, the first wavelength range comprises wavelength longer than the second wavelength range; the first light emitting layer comprises a first host material doped with a first guest material; the second light emitting layer comprises a second host material doped with a second guest material; the second guest material is configured to generate singlet excitons and triplet excitons; the singlet excitons are configured to generate the second light of the second wavelength range; and the triplet excitons are transported to the first light emitting layer to generate the first light of the first wavelength range.

Optionally, the second guest material comprises an iridium (III) complex.

Optionally, the second guest material is selected from a group consisting of fac-Ir(pmp)3, fac-Ir(pmb)3, and N-heterocyclic carbene (NHC) Ir(III) complexes.

Optionally, the first light emitting layer and the second light emitting layer respectively comprise an N-type host material; the light emitting element further comprises a hole injection layer and an electron injection layer; the first light emitting layer is between the electron injection layer and the second light emitting layer; and the second light emitting layer is between the first light emitting layer and the hole injection layer.

Optionally, the first light emitting layer and the second light emitting layer respectively comprise a P-type host material; the light emitting element further comprises a hole injection layer and an electron injection layer; the first light emitting layer is between the hole injection layer and the second light emitting layer; and the second light emitting layer is between the first light emitting layer and the electron injection layer.

Optionally, each of the first light emitting layer, the intermediate layer, and the second light emitting layer includes a same P-type host material.

Optionally, each of the first light emitting layer, the intermediate layer, and the second light emitting layer includes a same N-type host material.

Optionally, the first wavelength range comprises 450 nm to 495 nm, or any sub-ranges thereof; and the second wavelength range comprises 380 nm to 450 nm, or any sub-ranges thereof.

Optionally, the composite light is absent of any ultraviolet light.

In another aspect, the present disclosure provides a light emitting substrate, comprising a plurality of light emitting elements, the plurality of light emitting elements comprising the light emitting element described herein.

Optionally, the plurality of light emitting elements respectively in the plurality of subpixels are substantially the same; the first light emitting layer throughout the plurality of subpixels is substantially uniform and comprises a same material; and the second light emitting layer throughout the plurality of subpixels is substantially uniform and comprises a same material.

In another aspect, the present disclosure provides a display panel, comprising the light emitting substrate described herein and a quantum dot layer on a side of the plurality of light emitting elements away from a base substrate, the quantum dot layer comprising quantum dot blocks of different colors respectively in different subpixels; wherein the quantum dot blocks of different colors are configured to respectively convert the composite light into light of different colors respectively in different subpixels.

Optionally, the plurality of subpixels comprises a subpixel of a first color, a subpixel of a second color, and a subpixel of a third color, wherein the first color, the second color, and the third color are three colors different from each other; wherein the quantum dot layer comprises a quantum dot block of the first color in the subpixel of the first color, and configured to convert the composite light into light of the first color; and a quantum dot block of the second color in the subpixel of the second color, and configured to convert the composite light into light of the second color; wherein the subpixel of the third color is absent of any quantum dot block.

Optionally, the composite light emits out of the subpixel of the third color as light of the third color.

Optionally, the display panel further comprises a color filter in the subpixel of the third color; wherein the composite light is configured to transmit through the color filter as light of the third color.

Optionally, the display panel further comprises a substantially transparent insulating block in the subpixel of the third color; wherein the composite light is configured to transmit through the substantially transparent insulating block as light of the third color.

In another aspect, the present disclosure provides a display apparatus, comprising the display panel described herein, and one or more integrated circuits connected to the display panel.

BRIEF DESCRIPTION OF THE FIGURES

The following drawings are merely examples for illustrative purposes according to various disclosed embodiments and are not intended to limit the scope of the present invention.

FIG. 4 is a schematic diagram of a light emitting element in some embodiments according to the present disclosure.

FIG. 5 is a cross-sectional view of a display panel in some embodiments according to the present disclosure.

FIG. 6 is a schematic diagram of a light emitting element in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional display panel utilizing a quantum dots layer as the color filter for converting an emitted light into light of different colors respectively in different subpixels, typically the light conversion efficiency by the quantum dots layer is relatively low.

Accordingly, the present disclosure provides, inter alia, a display panel, a display apparatus, a light emitting element, and a method of fabricating a display panel that substantially obviate one or more of the problems due to limitations and disadvantages of the related art. In one aspect, the present disclosure provides a display panel having a plurality of subpixels. In some embodiments, the display panel includes a base substrate; a plurality of light emitting elements on the base substrate; and a quantum dot layer on a side of the plurality of light emitting elements away from the base substrate, the quantum dot layer including quantum dot blocks of different colors respectively in different subpixels. Optionally, a respective one of the plurality of light emitting elements includes a first light emitting layer and a second light emitting layer sequentially stacked. Optionally, the first light emitting layer is configured to emit a first light of a first wavelength range. Optionally, the second light emitting layer is configured to emit a second light of a second wavelength range. Optionally, the second wavelength range is different from the first wavelength range. Optionally, the plurality of light emitting elements are configured to respectively emit a composite light including the first light of the first wavelength range and the second light of the second wavelength range in different subpixels. Optionally, the quantum dot blocks of different colors are configured to respectively convert the composite light into light of different colors respectively in different subpixels.

Various appropriate light emitting elements may be used in the present display panel. Examples of appropriate light emitting elements include organic light emitting diodes, quantum dots light emitting diodes, and micro light emitting diodes.

Figure 1:
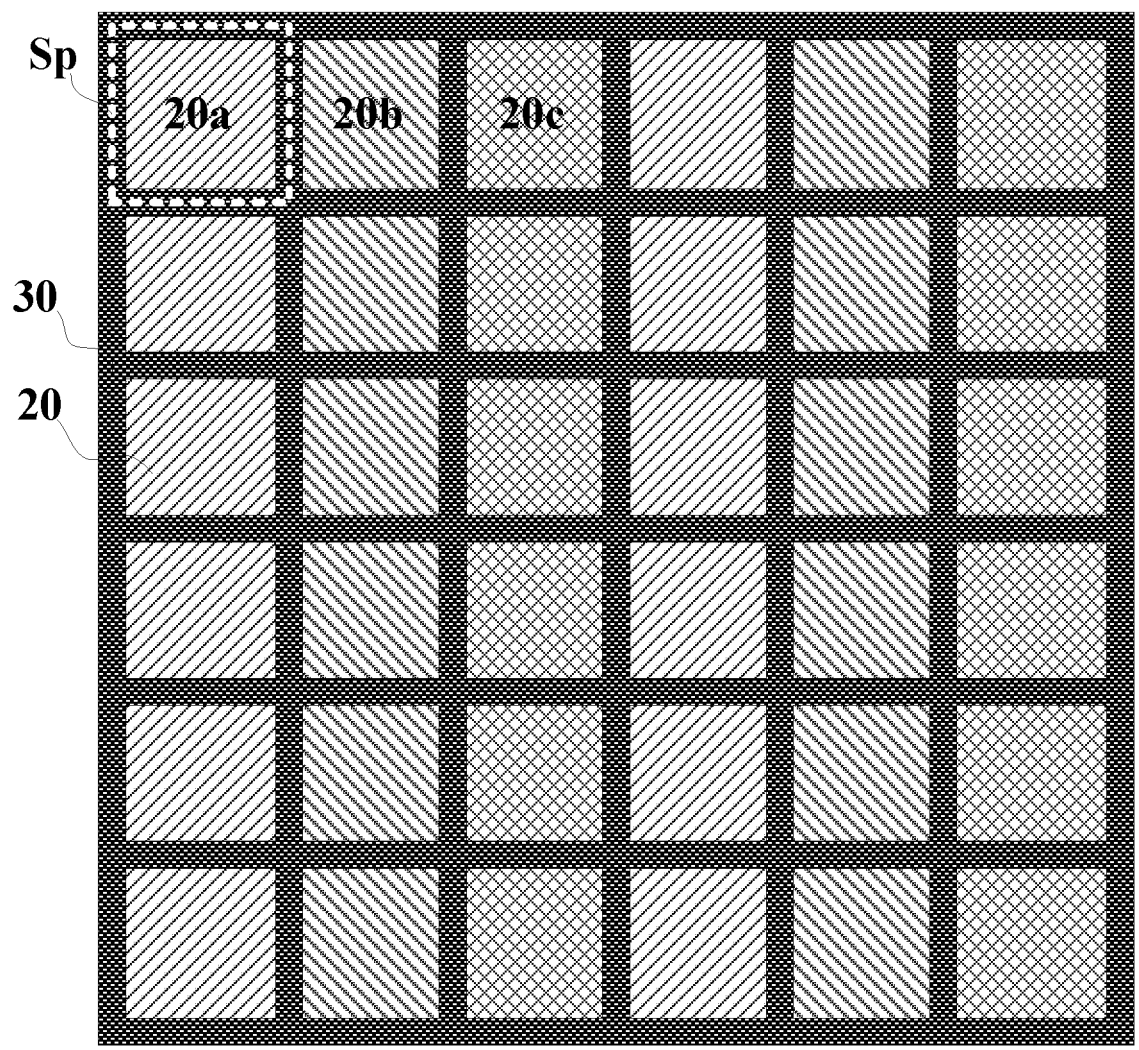
FIG. 1 is a plan view of a display panel in some embodiments according to the present disclosure.
Figure 2:
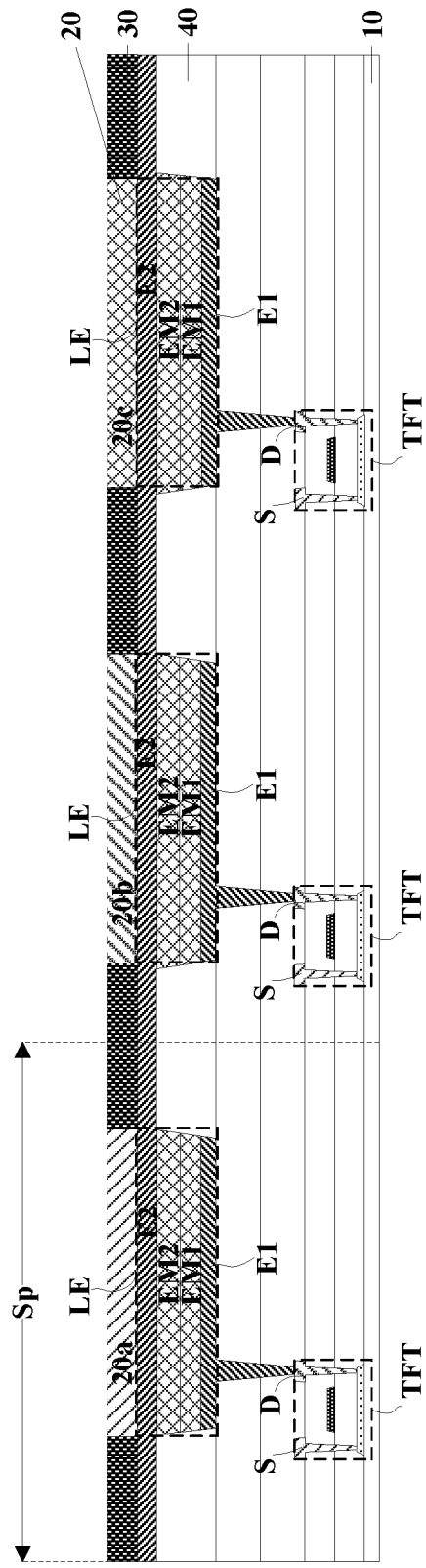
FIG. 2 is a cross-sectional view of a display panel in some embodiments according to the present disclosure.

FIG. 1 is a plan view of a display panel in some embodiments according to the present disclosure. FIG. 2 is a cross-sectional view of a display panel in some embodiments according to the present disclosure. Referring to FIG. 1 and FIG. 2, the display panel in some embodiments have a plurality of subpixels Sp. The display panel includes a base substrate 10; a plurality of light emitting elements LE on the base substrate 10; and a quantum dot layer 20 on a side of the plurality of light emitting elements LE away from the base substrate 10, the quantum dot layer 20 includes quantum dot blocks of different colors (for example, quantum dot blocks 20a, 20b, and 20c in FIG. 2) respectively in different subpixels. Optionally, a respective one of the plurality of light emitting elements LE includes a first electrode E1, a first light emitting layer EM1 on the first electrode E1, a second light emitting layer EM2 on a side of the first light emitting layer EM1 away from the first electrode E1, and a second electrode E2 on a side of the second light emitting layer EM2 away from the first light emitting layer EM1. Optionally, the display substrate further includes a plurality of thin film transistors TFT respectively in the plurality of subpixels Sp. A respective one of the plurality of thin film transistors TFT includes a source electrode S and a drain electrode D. The drain electrode D of the respective one of the plurality of thin film transistors TFT is electrically connected to the first electrode E1 of the respective one of the plurality of light emitting elements LE. Optionally, the display substrate further includes a pixel definition layer 40 defining a plurality of subpixel apertures. The first light emitting layer EM1 and the second light emitting layer EM2 of the respective one of the plurality of light emitting elements LE are in a respective one of the plurality of subpixel apertures. Optionally, the display substrate further includes a black matrix layer 30 in an inter-subpixel region of the display substrate.

In some embodiments, the plurality of light emitting elements LE are configured to respectively emit a composite light including the first light of the first wavelength range and the second light of the second wavelength range in different subpixels. For example, each of the plurality of light emitting elements LE is configured to emit the composite light including the first light of the first wavelength range and the second light of the second wavelength range. Optionally, the quantum dot blocks of different colors are configured to respectively convert the composite light into light of different colors respectively in different subpixels. In one example, the composite light is a composite light of a blue light and a violet light, and the plurality of light emitting elements LE are configured to respectively emit the same composite light. In another example, the quantum dot blocks includes a quantum dot block of a first color 20*a*, a quantum dot block of a second color 20*b*, and a quantum dot block of a third color 20*c*. The plurality of subpixels Sp includes a subpixel of a first color (e.g., a red subpixel), a subpixel of a second color (e.g., a green subpixel), and a subpixel of a third color (e.g., a blue subpixel). In another example, the subpixel of a first color includes the quantum dot block of a first color 20*a* configured to convert the composite light into a red light; the subpixel of a second color includes the quantum dot block of a second color 20*b* configured to convert the composite light into a green light; and the subpixel of a third color includes the quantum dot block of a third color 20*c* configured to convert the composite light into a blue light.

Figure 3:
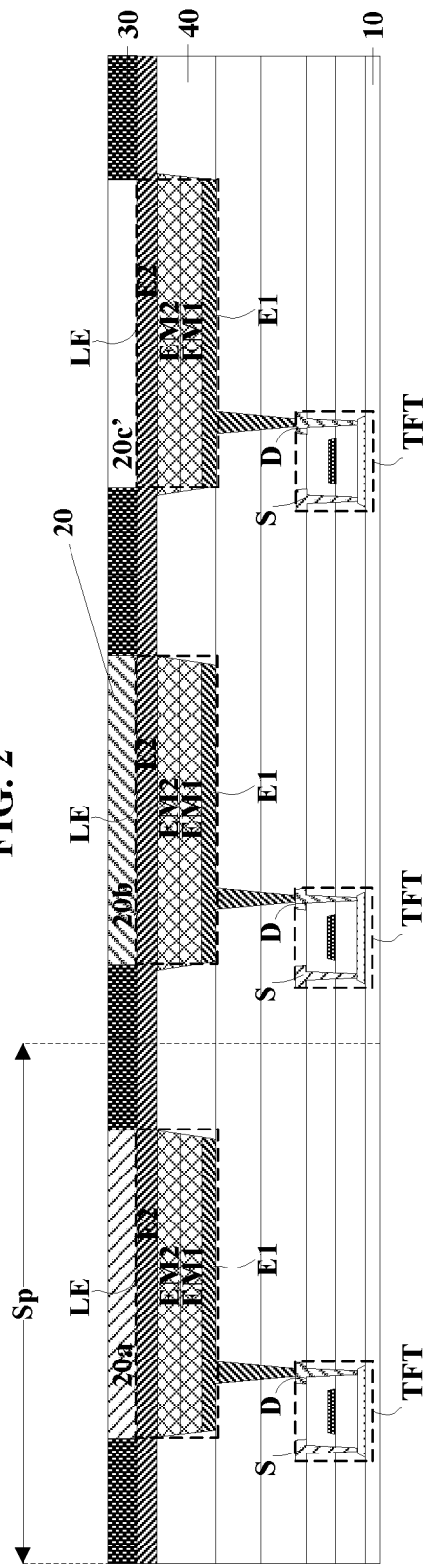
FIG. 3 is a cross-sectional view of a display panel in some embodiments according to the present disclosure.

FIG. 3 is a cross-sectional view of a display panel in some embodiments according to the present disclosure. Referring to FIG. 3, in some embodiments, the quantum dot blocks are absent in at least a subpixel of a certain color. In one example, the subpixel of the first color includes the quantum dot block of a first color 20*a* configured to convert the composite light into a red light; the subpixel of the second color includes the quantum dot block of a second color 20*b* configured to convert the composite light into a green light; and the quantum dot blocks are absent in the subpixel of the third color. In lieu of a quantum dot block, the subpixel of the third color may include a block 20*c*' on a side of the respective one of the plurality of light emitting elements LE away from the base substrate 10 in the subpixel of the third color. Optionally, the block 20*c*' is a substantially transparent insulating block, and the composite light emits out of the subpixel of the third color as light of the third color. Optionally, the block 20*c*' is a color filter in the subpixel of the third color; and the composite light transmits through the color filter as light of the third color.

Referring to FIG. 2 and FIG. 3, in some embodiments, a respective one of the plurality of light emitting elements LE includes a first light emitting layer EM1 and a second light emitting layer EM2 sequentially stacked. Optionally, the first light emitting layer EM1 is configured to emit a first light of a first wavelength range. Optionally, the second light emitting layer EM2 is configured to emit a second light of a second wavelength range. Optionally, the second wavelength range is different from the first wavelength range. Optionally, the second light emitting layer EM2 is on a side of the first light emitting layer EM1 away from the base substrate 10.

FIG. 4 is a schematic diagram of a light emitting element in some embodiments according to the present disclosure. Referring to FIGS. 2 to 4, in some embodiments, a respective one of the plurality of light emitting elements LE includes a first electrode E1 (e.g., an anode) on the base substrate 10, a hole injection layer HIL on a side of the first electrode E1 away from the base substrate 10, a hole transport layer HTL on a side of the hole injection layer HIL away from the base substrate 10, a first light emitting layer EM1 on a side of the hole transport layer HTL away from the base substrate 10, an intermediate layer IML on a side of the first light emitting layer EM1 away from the base substrate 10, a second light emitting layer EM2 on a side of the intermediate layer IML away from the base substrate 10, a hole barrier layer HBL on a side of the second light emitting layer EM2 away from the base substrate 10, an electron transport layer ETL on a side of the hole barrier layer HBL away from the base substrate 10, an electron injection layer EIL on a side of the electron transport layer ETL away from the base substrate 10, and a second electrode E2 (e.g., a cathode) on a side of the electron injection layer EIL away from the base substrate 10. Optionally, the first light emitting layer EM1 is a blue light emitting layer, and the second light emitting layer EM2 is a violet light emitting layer. Optionally, the first wavelength range includes 450 nm to 495 nm, or any sub-ranges thereof; and the second wavelength range includes 380 nm to 450 nm, or any sub-ranges thereof.

FIG. 5 is a cross-sectional view of a display panel in some embodiments according to the present disclosure. Referring to FIG. 5, in some embodiments, a respective one of the plurality of light emitting elements LE includes a first light emitting layer EM1 and a second light emitting layer EM2 sequentially stacked. Optionally, the first light emitting layer EM1 is configured to emit a first light of a first wavelength range. Optionally, the second light emitting layer EM2 is configured to emit a second light of a second wavelength range. Optionally, the second wavelength range is different from the first wavelength range. Optionally, the first light emitting layer EM1 is on a side of the second light emitting layer EM2 away from the base substrate 10.

FIG. 6 is a schematic diagram of a light emitting element in some embodiments according to the present disclosure. Referring to FIG. 5 and FIG. 6, in some embodiments, a respective one of the plurality of light emitting elements LE includes a first electrode E1 (e.g., an anode) on the base substrate 10, a hole injection layer HIL on a side of the first electrode E1 away from the base substrate 10, a hole transport layer HTL on a side of the hole injection layer HIL away from the base substrate 10, a second light emitting layer EM2 on a side of the hole transport layer HTL away from the base substrate 10, an intermediate layer IML on a side of the second light emitting layer EM2 away from the base substrate 10, a first light emitting layer EM1 on a side of the intermediate layer IML away from the base substrate 10, a hole barrier layer HBL on a side of the first light emitting layer EM1 away from the base substrate 10, an electron transport layer ETL on a side of the hole barrier layer HBL away from the base substrate 10, an electron injection layer EIL on a side of the electron transport layer ETL away from the base substrate 10, and a second electrode E2 (e.g., a cathode) on a side of the electron injection layer EIL away from the base substrate 10. Optionally, the first light emitting layer EM1 is a blue light emitting layer, and the second light emitting layer EM2 is a violet light emitting layer. Optionally, the first wavelength range includes 450 nm to 495 nm, or any sub-ranges thereof; and the second wavelength range includes 380 nm to 450 nm, or any sub-ranges thereof.

In some embodiments, and referring to FIG. 4 and FIG. 6, the respective one of the plurality of light emitting elements LE further includes an intermediate layer IML between the first light emitting layer EM1 and the second light emitting layer EM2. Optionally, the intermediate layer IML is in direct contact with the first light emitting layer EM1 on one side and in direct contact with the second light emitting layer EM2 on another side. Referring to FIG. 4, the intermediate layer IML is on a side of the first light emitting layer EM1 away from the base substrate 10. Referring to FIG. 6, the intermediate layer IML is on a side of the second light emitting layer EM2 away from the base substrate 10. In some embodiments, the intermediate layer IML is a non-light emitting layer, e.g., an undoped layer absent of a dopant for emitting light.

In some embodiments, the first wavelength range includes wavelength longer than the second wavelength range. For example, the first wavelength range includes 450 nm to 495 nm, or any sub-ranges thereof; and the second wavelength range includes 380 nm to 450 nm, or any sub-ranges thereof. In some embodiments, the first light emitting layer EM1 includes a first host material doped with a first guest material; the second light emitting layer includes a second host material doped with a second guest material; and the intermediate layer IML is an undoped layer absent of a dopant for emitting light. In one example, each of the intermediate layer IML, the first light emitting layer EM1, and the second light emitting layer EM2 includes a same host material, and the intermediate layer IML is an undoped layer absent of a guest material.

Figure 7:
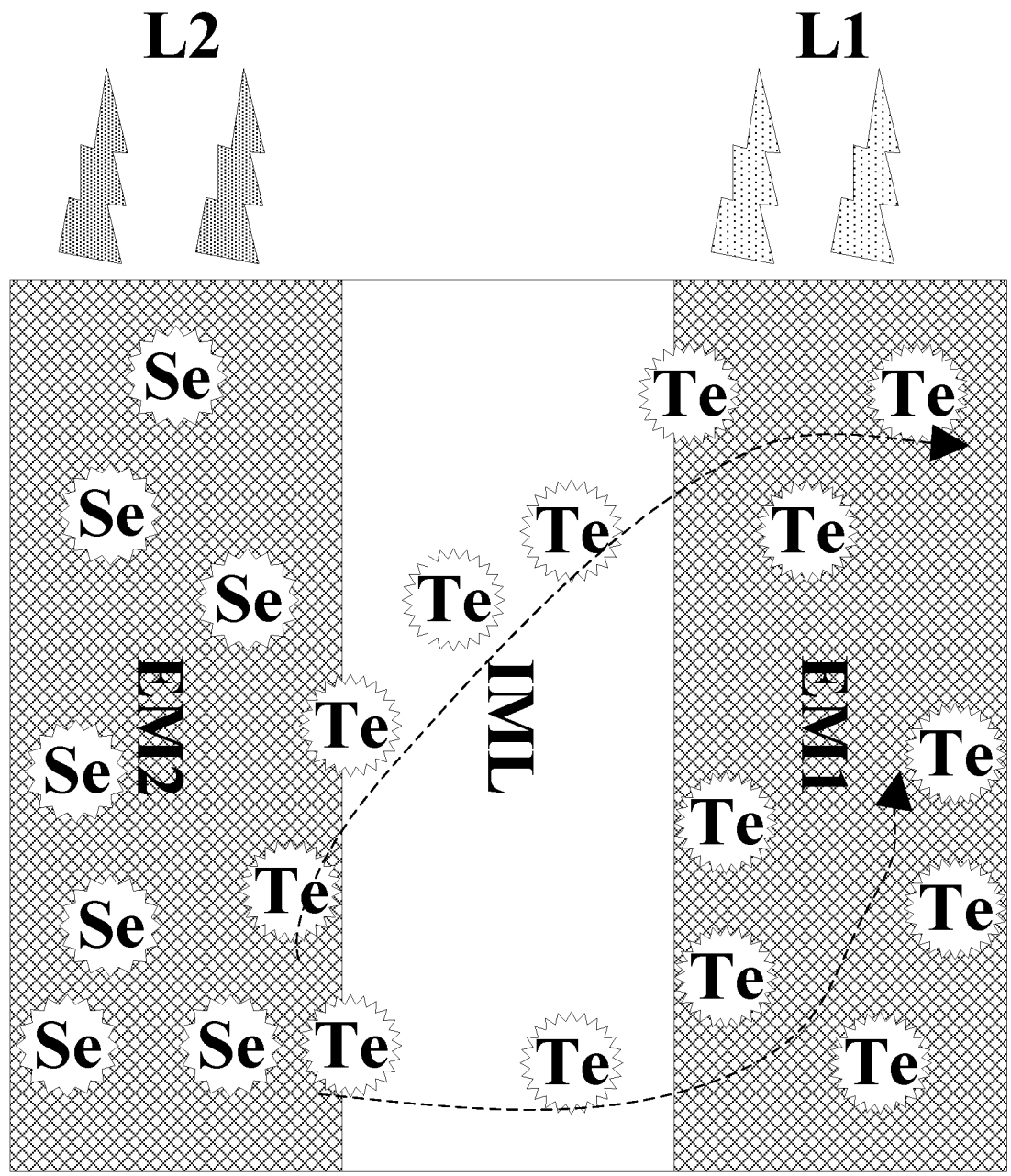
FIG. 7 illustrates a light emitting mechanism in a light emitting element in some embodiments according to the present disclosure.

FIG. 7 illustrates a light emitting mechanism in a light emitting element in some embodiments according to the present disclosure. Referring to FIG. 7, in some embodiments, when the respective one of the plurality of light emitting elements is configured to emit light, the second guest material in the second light emitting layer EM2 is configured to generate singlet excitons Se and triplet excitons Te. The singlet excitons Se are configured to generate a second light L2 of the second wavelength range. The triplet excitons Te are transported through the intermediate layer IML to the first light emitting layer EM1 to generate a first light L1 of the first wavelength range. Optionally, the first light L1 is a blue light, and the second light L2 is a violet light. Optionally, the first wavelength range includes 450 nm to 495 nm, or any sub-ranges thereof; and the second wavelength range includes 380 nm to 450 nm, or any sub-ranges thereof.

In some embodiments, the first guest material has a first HOMO-LUMO energy gap; the second guest material has a second HOMO-LUMO energy gap; and the second HOMO-LUMO energy gap is greater than the first HOMO-LUMO energy gap. Optionally, a ratio of the second HOMO-LUMO energy gap to the first HOMO-LUMO energy gap is greater than 1.2:1, e.g., greater than 1.3:1, greater than 1.4:1, greater than 1.5:1, greater than 1.6:1, greater than 1.7:1, greater than 1.8:1, greater than 1.9:1, or greater than 2.0:1.

Referring to FIGS. 2 to 4, in some embodiments, the first light emitting layer EM1 and the second light emitting layer EM2 respectively include an N-type host material. Optionally, the second light emitting layer EM2 is on a side of the first light emitting layer EM1 away from the base substrate 10. Optionally, the respective one of the plurality of light emitting elements LE further includes a hole injection layer HIL and an electron injection layer EIL; the second light emitting layer EM2 is between the electron injection layer EIL and the first light emitting layer EM1; and the first light emitting layer EM1 is between the second light emitting layer EM2 and the hole injection layer HIL. Optionally, the N-type host material is selected from a host material having a relatively large HOMO-LUMO energy gap.

In some embodiments, each of the first light emitting layer EM1, the intermediate layer IML, and the second light emitting layer EM2 includes an N-type host material. Optionally, each of the first light emitting layer EM1, the intermediate layer IML, and the second light emitting layer EM2 includes a same N-type host material.

Referring to FIG. 5 and FIG. 6, in some embodiments, the first light emitting layer EM1 and the second light emitting layer EM2 respectively include a P-type host material. Optionally, the first light emitting layer EM1 is on a side of the second light emitting layer EM2 away from the base substrate 10. Optionally, the respective one of the plurality of light emitting elements LE further includes a hole injection layer HIL and an electron injection layer EIL; the second light emitting layer EM2 is between the hole injection layer HIL and the first light emitting layer EM1; and the first light emitting layer EM1 is between the second light emitting layer EM2 and the electron injection layer EIL. Optionally, the P-type host material is selected from a host material having a relatively large HOMO-LUMO energy gap.

In some embodiments, each of the first light emitting layer EM1, the intermediate layer IML, and the second light emitting layer EM2 includes a P-type host material. Optionally, each of the first light emitting layer EM1, the intermediate layer IML, and the second light emitting layer EM2 includes a same P-type host material.

As used herein, the term "N-type host material" refers to a host material capable of transferring electrons, e.g., having an electron mobility greater than its hole mobility. Examples of appropriate N-type host materials include Alq3(tris(8-hydroxyquinolino)aluminum), Liq(8-hydroxyquinolinolato-lithium), PBD(2-(4-biphenylyl)-5-(4-tert-butylphenyl)-1,3, 4oxadiazole), TAZ(3-(4-biphenyl) 4-phenyl-5-tert-butylphenyl-1,2,4-triazole), spiro-PBD, and any one or more materials selected from the group consisting of BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole), oxadiazole, triazole, phenanthroline, benzoxazole, or benzthiazole. Optionally, the N-type host material includes diphenyl-4-triphenylsilylphenyl-phosphineoxide (TSPO1). Optionally, the N-type host material includes bis[2-(diphenylphosphino)phenyl] ether oxide (DPEPO).

As used herein, the term "P-type host material" refers to a host material capable of transferring holes, e.g., having a hole mobility greater than its electron mobility. Examples of appropriate P-type host materials include NPD (N,N-di-naphthyl-N,N'-diphenylbenzidine)(N,N'-bis(naphthalene-1-yl)-N,N'-bis(phenyl)-2,2'-dimethylbenzidine), TPD (N,N'-bis-(3-methylphenyl)-N,N'-bis-(phenyl)-benzidine), and MT DATA (4,4',4-Tris(N-3-methylphenyl-N-phenyl-amino)-triphenylamine). Optionally, the P-type host material includes 3,3-bis(carbazol-9-yl)biphenyl (mCBP).

Various appropriate guest materials may be used for doping the host material, including the N-type host material and the P-type host material. In one example, the first light emitting layer EM1 is a blue light emitting layer, and the second light emitting layer EM2 is a violet light emitting layer. In another example, the second light emitting layer EM2 includes a second host material (e.g., an N-type host material or a P-type host material) doped with a second guest material. Examples of appropriate second guest materials include an iridium (III) complex such as fac-Ir(pmp)3, fac-Ir(pmb)3, and N-heterocyclic carbene (NHC) Ir(III) complexes. In another example, the first light emitting layer EM1 includes a first host material (e.g., an N-type host material or a P-type host material) doped with a first guest material. Examples of appropriate first guest materials include 2,5,8,11-Tetra-tert-butylperylene, BCzVBi, 4,4'-[1, 4-phenylenedi-(1E)-2,1-ethenediyl]bis[N,N-diphenylbenzenamine], 9,10-di(naphthalene-2-yl) anthrascene (ADN), N-(4-((E)-2-(6-((E)-4-(diphenylamino)styryl)naphthalene-2-yl)vinyl)phenyl-N-phenylbenzenamine) (NBDAVBi), and Firbic.

In some embodiments, the plurality of light emitting elements LE respectively in the plurality of subpixels Sp are substantially the same. Optionally, the first light emitting layer EM1 throughout the plurality of subpixels Sp is substantially uniform and includes a same material. Optionally, the second light emitting layer EM2 throughout the plurality of subpixels Sp is substantially uniform and includes a same material. For example, the first light emitting layer EM1 throughout a subpixel of a red color, a subpixel of a green color, and a subpixel of a blue color is substantially uniform and includes a same material; and the second light emitting layer EM2 throughout the subpixel of a red color, the subpixel of a green color, and the subpixel of a blue color is substantially uniform and includes a same material.

In some embodiments, the composite light emitted from the plurality of light emitting elements LE is absent of any ultraviolet light. For example, none of the first light emitting layer EM1 and the second light emitting layer EM2 throughout the plurality of subpixels Sp emits ultraviolet light. Specifically, the plurality of light emitting elements LE do not include any ultraviolet light emitting layer or any ultraviolet light emitting material.

Various appropriate hole transport materials may be used for making the hole transport layer. Examples of appropriate hole transport materials include, but are not limited to, various p-type polymer materials and various p-type low-molecular-weight materials, e.g., polythiophene, polyaniline, polypyrrole, and a mixture having poly-3,4-ethylenedioxythiophene and poly(sodium-p-styrenesulfonate).

Various appropriate hole injection materials may be used for making the hole injection layer. Examples of appropriate hole injection materials include, but are not limited to, poly(3,4-ethylenedioxythiophene) polystyrene sulfonate (PEDOT:PSS), polythiophene, polyaniline, polypyrrole, copper phthalocyanine and 4,4',4''-tris(N,N-phenyl-3-methylphenylamino)triphenylamine (m-MTDATA).

Various appropriate electron transport materials may be used to make the electron transport layer. Examples of appropriate electron transport materials include, but are not limited to, 4,7, -diphenyl-1,10-phenanthroline, 2,9-Bis(naphthalen-2-yl)-4,7-diphenyl-1,10-phenanthroline, 2,9-dimethyl-4,7-diphenyl-1,10-phenanthroline, 8-hydroxyquinoline aluminum, 8-hydroxyquinoline lithium, Bis(8-hydroxy-2-methylquinoline)-(4-phenylphenoxy)aluminum, tris(8-quinolinolate)aluminum, 3-(biphenyl-4-yl)-5-(4-tertbutylphenyl)-4-phenyl-4H-1,2,4-triazole, bis(10-hydroxybenzo[h]quinolinato beryllium), and 1,3,5-tris(N-phenylbenzimidazole-2-yl)benzene.

Various appropriate electron injection materials may be used for making the electron injection layer. Examples of appropriate electron injection materials include, but are not limited to, lithium fluoride and 8-hydroxyquinoline lithium.

In another aspect, the present disclosure provides a display apparatus including a display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a light emitting element. In some embodiments, the light emitting element includes a first light emitting layer and a second light emitting layer sequentially stacked; and an intermediate layer between the first light emitting layer and the second light emitting layer, and being in direct contact with the first light emitting layer on one side and in direct contact with the second light emitting layer on another side. Optionally, the first light emitting layer is configured to emit a first light of a first wavelength range; the second light emitting layer is configured to emit a second light of a second wavelength range; and the first wavelength range is greater than the second wavelength range. Optionally, each of the intermediate layer, the first light emitting layer, and the second light emitting layer includes a same host material.

Optionally, the first light emitting layer further comprises a first guest material; and the second light emitting layer further comprises a second guest material. Optionally, the first guest material has a first HOMO-LUMO energy gap; the second guest material has a second HOMO-LUMO energy gap; and the second HOMO-LUMO energy gap is greater than the first HOMO-LUMO energy gap. Optionally, the intermediate layer is a non-light emitting layer, and is an undoped layer absent of a dopant for emitting light.

Optionally, the light emitting element is configured to emit a composite light comprising the first light of the first wavelength range and the second light of the second wavelength range.

Optionally, the second guest material is configured to generate singlet excitons and triplet excitons; the singlet excitons are configured to generate the second light of the second wavelength range; and the triplet excitons are transported to the first light emitting layer to generate the first light of the first wavelength range.

In some embodiments, the light emitting element includes a first electrode (e.g., an anode) on the base substrate, a hole injection layer on a side of the first electrode away from the base substrate, a hole transport layer on a side of the hole injection layer away from the base substrate, a first light emitting layer on a side of the hole transport layer away from the base substrate, an intermediate layer on a side of the first light emitting layer away from the base substrate, a second light emitting layer on a side of the intermediate layer away from the base substrate, a hole barrier layer on a side of the second light emitting layer away from the base substrate, an electron transport layer on a side of the hole barrier layer away from the base substrate, an electron injection layer on a side of the electron transport layer away from the base substrate, and a second electrode (e.g., a cathode) on a side of the electron injection layer away from the base substrate. Optionally, the first light emitting layer is a blue light emitting layer, and the second light emitting layer is a violet light emitting layer. Optionally, the first wavelength range includes 450 nm to 495 nm, or any sub-ranges thereof; and the second wavelength range includes 380 nm to 450 nm, or any sub-ranges thereof.

In some embodiments, the light emitting element includes a first light emitting layer and a second light emitting layer sequentially stacked. Optionally, the first light emitting layer is configured to emit a first light of a first wavelength range. Optionally, the second light emitting layer is configured to emit a second light of a second wavelength range. Optionally, the second wavelength range is different from the first wavelength range. Optionally, the first light emitting layer is on a side of the second light emitting layer away from the base substrate.

In some embodiments, the light emitting element includes a first electrode (e.g., an anode) on the base substrate, a hole injection layer on a side of the first electrode away from the base substrate, a hole transport layer on a side of the hole injection layer away from the base substrate, a second light emitting layer on a side of the hole transport layer away from the base substrate, an intermediate layer on a side of the second light emitting layer away from the base substrate, a first light emitting layer on a side of the intermediate layer away from the base substrate, a hole barrier layer on a side of the first light emitting layer away from the base substrate, an electron transport layer on a side of the hole barrier layer away from the base substrate, an electron injection layer on a side of the electron transport layer away from the base substrate, and a second electrode (e.g., a cathode) on a side of the electron injection layer away from the base substrate. Optionally, the first light emitting layer is a blue light emitting layer, and the second light emitting layer is a violet light emitting layer. Optionally, the first wavelength range includes 450 nm to 495 nm, or any sub-ranges thereof; and the second wavelength range includes 380 nm to 450 nm, or any sub-ranges thereof.

Optionally, the intermediate layer is on a side of the first light emitting layer away from the base substrate. Optionally, the intermediate layer is on a side of the second light emitting layer away from the base substrate. Optionally, the intermediate layer is a non-light emitting layer, e.g., an undoped layer absent of a dopant for emitting light.

In some embodiments, the first wavelength range includes wavelength longer than the second wavelength range. For example, the first wavelength range includes 450 nm to 495 nm, or any sub-ranges thereof; and the second wavelength range includes 380 nm to 450 nm, or any sub-ranges thereof. In some embodiments, the first light emitting layer includes a first host material doped with a first guest material; the second light emitting layer includes a second host material doped with a second guest material; and the intermediate layer is an undoped layer absent of a dopant for emitting light. In one example, each of the intermediate layer, the first light emitting layer, and the second light emitting layer includes a same host material, and the intermediate layer is an undoped layer absent of a guest material.

In some embodiments, the first guest material has a first HOMO-LUMO energy gap; the second guest material has a second HOMO-LUMO energy gap; and the second HOMO-LUMO energy gap is greater than the first HOMO-LUMO energy gap. Optionally, a ratio of the second HOMO-LUMO energy gap to the first HOMO-LUMO energy gap is greater than 1.2:1, e.g., greater than 1.3:1, greater than 1.4:1, greater than 1.5:1, greater than 1.6:1, greater than 1.7:1, greater than 1.8:1, greater than 1.9:1, or greater than 2.0:1.

In some embodiments, the first light emitting layer and the second light emitting layer respectively include an N-type host material. Optionally, the second light emitting layer is on a side of the first light emitting layer away from the base substrate. Optionally, the light emitting element further includes a hole injection layer and an electron injection layer; the first light emitting layer is between the electron injection layer and the second light emitting layer; and the second light emitting layer is between the first light emitting layer and the hole injection layer. Optionally, the N-type host material is selected from a host material having a relatively large HOMO-LUMO energy gap.

In some embodiments, each of the first light emitting layer, the intermediate layer, and the second light emitting layer includes an N-type host material. Optionally, each of the first light emitting layer, the intermediate layer, and the second light emitting layer includes a same N-type host material.

In some embodiments, the first light emitting layer and the second light emitting layer respectively include a P-type host material. Optionally, the first light emitting layer is on a side of the second light emitting layer away from the base substrate. Optionally, the light emitting element further includes a hole injection layer and an electron injection layer; the first light emitting layer is between the hole injection layer and the second light emitting layer; and the second light emitting layer is between the first light emitting layer and the electron injection layer. Optionally, the P-type host material is selected from a host material having a relatively large HOMO-LUMO energy gap.

In some embodiments, each of the first light emitting layer, the intermediate layer, and the second light emitting layer includes a P-type host material. Optionally, each of the first light emitting layer, the intermediate layer, and the second light emitting layer includes a same P-type host material.

In some embodiments, the composite light emitted from the light emitting element is absent of any ultraviolet light. For example, none of the first light emitting layer and the second light emitting layer emits ultraviolet light. Specifically, the light emitting element do not include any ultraviolet light emitting layer or any ultraviolet light emitting material.

In another aspect, the present disclosure provides a method of fabricating a display panel. In some embodiments, the method includes forming a plurality of light emitting elements on a base substrate; and forming a quantum dot layer on a side of the plurality of light emitting elements away from the base substrate, the quantum dot layer formed to comprise quantum dot blocks of different colors respectively in different subpixels. In some embodiments, forming a respective one of the plurality of light emitting elements includes forming a first light emitting layer and a second light emitting layer sequentially stacked. Optionally, the first light emitting layer is configured to emit a first light of a first wavelength range. Optionally, the second light emitting layer is configured to emit a second light of a second wavelength range. Optionally, the second wavelength range is different from the first wavelength range. Optionally, the plurality of light emitting elements are configured to respectively emit a composite light including the first light of the first wavelength range and the second light of the second wavelength range in different subpixels. Optionally, the quantum dot blocks of different colors are configured to respectively convert the composite light into light of different colors respectively in different subpixels.

In some embodiments, forming the respective one of the plurality of light emitting elements further includes forming an intermediate layer between the first light emitting layer and the second light emitting layer. The intermediate layer is in direct contact with the first light emitting layer on one side and in direct contact with the second light emitting layer on another side. Optionally, the intermediate layer is a non-light emitting layer. Optionally, the intermediate layer is an undoped layer absent of a dopant for emitting light.

In some embodiments, the first wavelength range is greater than the second wavelength range. Optionally, forming the first light emitting layer includes doping a first host material with a first guest material; and forming the second light emitting layer includes doping a second host material with a second guest material. Optionally, when the respective one of the plurality of light emitting elements is configured to emit light, the second guest material is configured to generate singlet excitons and triplet excitons; the singlet excitons are configured to generate the second light of the second wavelength range; and the triplet excitons are transported to the first light emitting layer to generate the first light of the first wavelength range. Optionally, the first guest material has a first HOMO-LUMO energy gap; the second guest material has a second HOMO-LUMO energy gap; and the second HOMO-LUMO energy gap is greater than the first HOMO-LUMO energy gap. Optionally, a ratio of the second HOMO-LUMO energy gap to the first HOMO-LUMO energy gap is greater than 1.2:1.

In some embodiments, forming the respective one of the plurality of light emitting elements further includes forming an intermediate layer between the first light emitting layer and the second light emitting layer. The intermediate layer is in direct contact with the first light emitting layer on one side and in direct contact with the second light emitting layer on another side. Optionally, the intermediate layer is a non-light emitting layer. Optionally, each of the intermediate layer, the first light emitting layer, and the second light emitting layer is formed using a same host material. Optionally, the intermediate layer is an undoped layer absent of a guest material.

In some embodiments, the first light emitting layer and the second light emitting layer are respectively formed using an N-type host material. Optionally, forming the respective one of the plurality of light emitting elements further includes forming a hole injection layer and forming an electron injection layer. Optionally, the first light emitting layer is formed between the electron injection layer and the second light emitting layer; and the second light emitting layer is formed between the first light emitting layer and the hole injection layer.

In some embodiments, the first light emitting layer and the second light emitting layer are respectively formed using a P-type host material. Optionally, forming the respective one of the plurality of light emitting elements further includes forming a hole injection layer and forming an electron injection layer. Optionally, the first light emitting layer is formed between the hole injection layer and the second light emitting layer; and the second light emitting layer is formed between the first light emitting layer and the electron injection layer.

In some embodiments, the plurality of subpixels include a subpixel of a first color, a subpixel of a second color, and a subpixel of a third color. The first color, the second color, and the third color are three colors different from each other. Optionally, forming the quantum dot layer includes forming a quantum dot block of the first color in the subpixel of the first color, and configured to convert the composite light into light of the first color; and forming a quantum dot block of the second color in the subpixel of the second color, and configured to convert the composite light into light of the second color. Optionally, the subpixel of the third color is absent of any quantum dot block. Optionally, the method further includes forming a color filter in the subpixel of the third color.

In some embodiments, the plurality of light emitting elements respectively in the plurality of subpixels are substantially the same. Optionally, the first light emitting layer throughout the plurality of subpixels is substantially uniform, and is formed in a same patterning step using a same material. Optionally, the second light emitting layer throughout the plurality of subpixels is substantially uniform, and is formed in a same patterning step using a same material.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting element, comprising:
    a first light emitting layer and a second light emitting layer sequentially stacked; and
    an intermediate layer between the first light emitting layer and the second light emitting layer, and being in direct contact with the first light emitting layer on one side and in direct contact with the second light emitting layer on another side;
    wherein the first light emitting layer is configured to emit a first light of a first wavelength range;
    the second light emitting layer is configured to emit a second light of a second wavelength range;
    the first wavelength range comprises wavelength longer than the second wavelength range;
    each of the intermediate layer, the first light emitting layer, and the second light emitting layer comprises a same host material;
    the intermediate layer is a non-light emitting layer, and is an undoped layer absent of a dopant for emitting light; and
    the light emitting element is configured to emit a composite light comprising the first light of the first wavelength range and the second light of the second wavelength range.

2. The light emitting element of claim 1, wherein the first light emitting layer further comprises a first guest material; the second light emitting layer further comprises a second guest material;

the first guest material has a first HOMO-LUMO energy gap;

the second guest material has a second HOMO-LUMO energy gap; and the second HOMO-LUMO energy gap is greater than the first HOMO-LUMO energy gap.

3. The light emitting element of claim 2, wherein a ratio of the second HOMO-LUMO energy gap to the first HOMO-LUMO energy gap is greater than 1.2:1.

4. The light emitting element of claim 1, wherein the first wavelength range comprises wavelength longer than the second wavelength range;

the first light emitting layer comprises a first host material doped with a first guest material;

the second light emitting layer comprises a second host material doped with a second guest material;

the second guest material is configured to generate singlet excitons and triplet excitons;

the singlet excitons are configured to generate the second light of the second wavelength range; and the triplet excitons are transported to the first light emitting layer to generate the first light of the first wavelength range.

5. The light emitting element of claim 4, wherein the second guest material comprises an iridium (III) complex.

6. The light emitting element of claim 4, wherein the second guest material is selected from a group consisting of fac-Ir(pmp)3, fac-Ir(pmb)3, and N-heterocyclic carbene (NHC) Ir(III) complexes.

7. The light emitting element of claim 1, wherein the first light emitting layer and the second light emitting layer respectively comprise an N-type host material;

the light emitting element further comprises a hole injection layer and an electron injection layer;

the first light emitting layer is between the electron injection layer and the second light emitting layer; and the second light emitting layer is between the first light emitting layer and the hole injection layer.

8. The light emitting element of claim 1, wherein the first light emitting layer and the second light emitting layer respectively comprise a P-type host material;

the light emitting element further comprises a hole injection layer and an electron injection layer;

the first light emitting layer is between the hole injection layer and the second light emitting layer; and the second light emitting layer is between the first light emitting layer and the electron injection layer.

9. The light emitting element of claim 1, wherein each of the first light emitting layer, the intermediate layer, and the second light emitting layer includes a same P-type host material.

10. The light emitting element of claim 1, wherein each of the first light emitting layer, the intermediate layer, and the second light emitting layer includes a same N-type host material.

11. The light emitting element of claim 1, wherein the first wavelength range comprises 450 nm to 495 nm, or any sub-ranges thereof; and the second wavelength range comprises 380 nm to 450 nm, or any sub-ranges thereof.

12. The light emitting element of claim 1, wherein the composite light is absent of any ultraviolet light.

13. A light emitting substrate, comprising a plurality of light emitting elements, the plurality of light emitting elements comprising the light emitting element of claim 1.

14. The light emitting substrate of claim 13, wherein the plurality of light emitting elements respectively in the plurality of subpixels are substantially the same;

the first light emitting layer throughout the plurality of subpixels is substantially uniform and comprises a same material; and the second light emitting layer throughout the plurality of subpixels is substantially uniform and comprises a same material.

15. A display panel, comprising the light emitting substrate of claim 13 and a quantum dot layer on a side of the plurality of light emitting elements away from a base substrate, the quantum dot layer comprising quantum dot blocks of different colors respectively in different subpixels;

wherein the quantum dot blocks of different colors are configured to respectively convert the composite light into light of different colors respectively in different subpixels.

16. The display panel of claim 15, wherein the plurality of subpixels comprises a subpixel of a first color, a subpixel of a second color, and a subpixel of a third color, wherein the first color, the second color, and the third color are three colors different from each other;

wherein the quantum dot layer comprises:

a quantum dot block of the first color in the subpixel of the first color, and configured to convert the composite light into light of the first color; and a quantum dot block of the second color in the subpixel of the second color, and configured to convert the composite light into light of the second color;

wherein the subpixel of the third color is absent of any quantum dot block.

17. The display panel of claim 16, wherein the composite light emits out of the subpixel of the third color as light of the third color.

18. The display panel of claim 16, further comprising a color filter in the subpixel of the third color;

wherein the composite light is configured to transmit through the color filter as light of the third color.

19. The display panel of claim 16, further comprising a substantially transparent insulating block in the subpixel of the third color;

wherein the composite light is configured to transmit through the substantially transparent insulating block as light of the third color.

20. A display apparatus, comprising the display panel of claim 13, and one or more integrated circuits connected to the display panel.

* * * * *